United States Patent
Griffin et al.

(10) Patent No.: US 10,214,415 B1
(45) Date of Patent: Feb. 26, 2019

(54) HYBRID CMOS-MEMS DEVICES ADAPTED FOR HIGH-TEMPERATURE OPERATION AND METHOD FOR THEIR MANUFACTURE

(71) Applicant: National Technology & Engineering Solutions of Sandia, LLC, Albuquerque, NM (US)

(72) Inventors: Benjamin Griffin, Albuquerque, NM (US); Scott D. Habermehl, Corrales, NM (US); Peggy J. Clews, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/910,531

(22) Filed: Mar. 2, 2018

(51) Int. Cl.
- *H01L 21/00* (2006.01)
- *B81C 1/00* (2006.01)
- *B81B 7/00* (2006.01)
- *B81B 7/02* (2006.01)

(52) U.S. Cl.
CPC ........ *B81C 1/00246* (2013.01); *B81B 7/0077* (2013.01); *B81B 7/02* (2013.01); *B81C 1/00214* (2013.01); *B81C 1/00269* (2013.01); *B81C 2203/0714* (2013.01); *B81C 2203/0735* (2013.01); *B81C 2203/0742* (2013.01)

(58) Field of Classification Search
None
See application file for complete search history.

(56) References Cited

U.S. PATENT DOCUMENTS

| | | | | |
|---|---|---|---|---|
| 8,367,305 | B1* | 2/2013 | Wojciechowski | H03H 9/462 430/319 |
| 9,484,216 | B1* | 11/2016 | Bauer | H01L 21/31122 |
| 9,546,420 | B1 | 1/2017 | Habermehl | |
| 9,796,582 | B1* | 10/2017 | Cheng | B81C 1/00246 |
| 2008/0150653 | A1* | 6/2008 | Hara | H03H 3/02 333/187 |
| 2010/0190270 | A1* | 7/2010 | Piazza | C12Q 1/6816 436/524 |
| 2013/0004370 | A1* | 1/2013 | Chen | G01N 29/022 422/69 |
| 2017/0301853 | A1* | 10/2017 | Xia | H01L 41/0474 |
| 2018/0312399 | A1* | 11/2018 | Singh | B81C 1/00039 |

OTHER PUBLICATIONS

Bhugra, H. et al., "AlN Thin Film Processing and Basic Properties," Piezoelectric MEMS Resonators, Ch. 1, pp. 3-37.
Griffin, B. et al., "High Temperature Microelectromechanical System Using Peizoelecteric Aluminum Nitiride", Sandia National Laboratories, SAND2014-2351C.

(Continued)

*Primary Examiner* — Kevin M Picardat
(74) *Attorney, Agent, or Firm* — Martin I. Finston

(57) ABSTRACT

A silicon carbide based MOS integrated circuit is monolithically integrated with a suspended piezoelectric aluminum nitride member to form a high-temperature-capable hybrid MEMS-over-MOS structure. In the integrated structure, a post-MOS passivation layer of silicon carbide is deposited over the MOS passivation and overlain by a structural layer of the MEMS device. Electrical contact to refractory metal conductors of the MOS integrated circuit is provided by tungsten vias that are formed so as to pass vertically through the structural layer and the post-MOS passivation layer.

19 Claims, 3 Drawing Sheets

(56) References Cited

OTHER PUBLICATIONS

Griffin, B. et al., "Development of an Aluminum Nitride-Silicon Carbide Material Set for High Temperature Sensor Applications", Sandia National Laboratories, SAND2015-8412C.

Griffin, B. et al., "Development of aluminum nitride-silicon carbide material set for high-temperature sensor applications", Proceedings of SPIE, 91130A-1, vol. 9113.

Habermehl, S. et al. "Formation of stress-controlled, highly textured, x-SiC thin films at 950 C", Journal of Applied Physics, 2012, 013535, vol. 112.

Luchinin, V. et al., "SiC-AlN-composition-based MEMS", Proceedings of SPIE, 1999, pp. 141-145.

Neudeck, P. et al., "Demonstration of 4H-SiC Digital Integrated Circuits Above 800C", IEEE Electron Device Letters, 2017, pp. 1082-1085, vol. 38.

Spry, D. J. et al., "Processing and Characterization of Thousand-Hour 500C Durable 4H-SiC JEFT Integrated Circuits", Jun. 2016 [Online]; Available: http://dx.doi.org/10.4071/2016-HITEC-249.

Spry, D. J. et al., "Prolonged 500C Demonstration of 4H-SiC JFET ICs with Two-Level Interconnect", IEEE Electron Device Letters, 2016, pp. 625-628, vol. 37.

Spry, D. J. et al., "Processing and Prolonged 500C Testing of 4H-SiC JFET Integrated Circuits with Two Levels of Metal Interconnect", Materials Science Forum, 2016, pp. 908-912, vol. 858.

Wijesundara, M. et al., "Silicon Carbide Microsystems for Harsh Environments", 2011, Ch. 3, pp. 97-124.

Wijesundara, M. et al., "Silicon Carbide Microsystems for Harsh Environments", 2011, Section 6.1.2, pp. 191-195.

\* cited by examiner

HYBRID CMOS-MEMS DEVICES ADAPTED FOR HIGH-TEMPERATURE OPERATION AND METHOD FOR THEIR MANUFACTURE

ACKNOWLEDGEMENT OF GOVERNMENT SUPPORT

This invention was made with Government support under Contract No. DE-NA0003525 awarded by the United States Department of Energy/National Nuclear Security Administration. The U.S. Government has certain rights in the invention.

FIELD OF THE INVENTION

The invention relates to fabrication techniques for microelectromechanical systems (MEMS) and devices made thereby, and more particularly to high-temperature-compatible systems and devices.

ART BACKGROUND

There is growing interest in high-temperature-capable semiconductor electronics for various applications, not least of which are electric power conversion and sensing in fuel-burning and other high-temperature environments. Silicon carbide (SiC) has emerged as an especially promising semiconductor electronic material because of its high thermal, mechanical, and electrical strength, because it has favorable properties as a switching material in transistors, and because it is compatible with CMOS processes.

Among semiconductors, only diamond has a greater mechanical strength than SiC. Crystalline silicon carbide maintains its structural integrity to temperatures above 2500° C.; at its high-temperature limit it sublimates rather than melting.

There has also been growing interest in the use of piezoelectric devices based on microelectromechanical systems (MEMS) technology for sensing and signal processing. In such devices, a piezoelectric element transduces signals between the mechanical or acoustic domain and the electrical or radiofrequency domain.

Piezoelectric thin-film aluminum nitride (AlN), in particular, has been recognized as a promising piezoelectric transducer material that is stable at high temperatures. Aluminum nitride can be used for piezoelectric transduction even at temperatures as high as 1000° C. or more.

In fact the piezoelectric properties of AlN persist up to 1150° C. It also has a coefficient of thermal expansion that closely matches that of silicon carbide. That coincidence offers the possibility to monolithically integrate AlN-based MEMS with SiC-based CMOS circuitry without risking degradation due to thermal mismatch, even at high temperatures.

The monolithic integration of MEMS with SiC-based CMOS is not without difficulties, however. This subject has been discussed by, among others, M. B. J. Wijesundara and R. G. Azevedo, *Silicon Carbide Microsystems for Harsh Environments*, Springer (2011), Section 6.1.2, pages 191-195.

As Wijesundara et al. point out, each step of the process flow must take into account the thermal budget and the chemical compatibility of the previous layers.

The same authors discuss three alternative schemes for hybrid integration, which they refer to as post-CMOS MEMS insertion (in which the MEMS circuit is fabricated last), interleaved CMOS insertion, and pre-CMOS insertion (in which the MEMS circuit is fabricated first).

The post-CMOS scheme is the most attractive, because it permits the MEMS structures to be fabricated on top of the CMOS integrated circuit. However, the authors note that the MEMS process will include deposition or annealing at temperatures outside the thermal budget of the underlying CMOS circuit. With conventional silicon-based CMOS, the MEMS process temperatures are therefore capped at 400-500° C. Even if the CMOS is based on silicon carbide, the process temperature must be limited to avoid degradation of metal contacts.

Thus there remains a need for new methods of post-CMOS fabrication of monolithically integrated hybrid devices that are high-temperature capable.

SUMMARY OF THE INVENTION

We have developed an apparatus, and a method for fabricating it, in which a SiC-based MOS integrated circuit is monolithically integrated with a suspended piezoelectric aluminum nitride member that may, for example, be a membrane, plate, or beam.

To practice our method, there is provided an MOS integrated circuit formed in a high-temperature-capable substrate such as a silicon carbide substrate. The MOS integrated circuit has one or more levels of refractory metal conductors isolated by an MOS passivation layer of silicon dioxide, aluminum nitride, or silicon carbide.

Atop the MOS integrated circuit, a post-MOS passivation layer of, e.g., silicon carbide is deposited by low-pressure chemical vapor deposition (LPCVD). A sacrificial release layer of, e.g., polycrystalline silicon is formed over the post-MOS passivation layer and then buried by a structural layer, exemplarily of SiC, deposited by LPCVD. The post-MOS passivation layer is so named because it is fabricated in a step that follows the fabrication of the underlying MOS device.

Electrical contact to refractory metal conductors of the MOS integrated circuit is provided by tungsten vias that are formed so as to pass vertically through the structural layer and the post-MOS passivation layer.

There follows a MEMS fabrication phase in which a bottom electrode is deposited over the SiC structural layer, and a layer of piezoelectric aluminum nitride (PZ-AlN), which is the precursor of the suspended AlN member, is deposited over the bottom electrode, patterned, and etched. A top electrode is formed, and the sacrificial release layer is removed to suspend the AlN membrane.

Importantly, the patterning and etching of the PZ-AlN member includes forming at least one hole through the member that extends down to the tungsten vias for contact with the CMOS metallization, and the forming of the top electrode includes filling the at least one hole with metal of the same composition as the top electrode.

In embodiments, the bottom electrode comprises a silicon carbide layer deposited by LPCVD or, alternatively, a titanium/titanium-nitride bilayer deposited by sputtering. Reactive sputter deposition or metalorganic chemical vapor deposition is used to deposit the layer of piezoelectric aluminum nitride (PZ-AlN) over the bottom electrode. The PZ-AlN layer is etched with a chlorine-based etch to define the conformation that includes at least one hole extending down to the tungsten vias.

In embodiments, the top electrode is formed by LPCVD of silicon carbide or by sputter deposition of titanium nitride.

In either case, the deposition includes filling the at least one hole etched in the PZ-AlN layer.

In embodiments, the PZ-AlN member is released by etching release trenches through the PZ-AlN layer and the structural layer down to the sacrificial release layer, and then removing the sacrificial release layer by isotropic fluorine-based etching.

DETAILED DESCRIPTION

High-temperature-capable, SiC-based integrated circuits are known. For example, high-temperature testing of JFET circuits based on the 4H phase of silicon carbide is reported in P. G. Neudeck et al., "Demonstration of 4H—SiC Digital Integrated Circuits Above 800° C.", *IEEE Electr. Dev. Lett.* 38 (August 2017) 1082-1085. The fabrication process for the integrated circuits (ICs) reported in Neudeck et al. is described in the following articles:

D. J. Spry et al., "Processing and prolonged 500° C. testing of 4H—SiC JFET integrated circuits with two levels of metal interconnect," *Mater. Sci. Forum* 828 (May 2016) 908-912, doi: 10.4028/www.scientific.net/MSF.858.908;

D. J. Spry et al., "Prolonged 500° C. demonstration of 4H—SiC JFET ICs with two-level interconnect," *IEEE Electron Device Lett.* 37, no. 5, 625-628 (May 2016), doi: 10.1109/LED.2016.2544700;

D. J. Spry et al., "Experimental durability testing of 4H SiC JFET integrated circuit technology at 727° C.," presented at the SPIE Meeting, May 2016 [Online]; Available: http://dx.doi.org/10.1117/12.2232926; and D. J. Spry et al., "Processing and characterization of thousand-hour 500° C. durable 4H—SiC JFET integrated circuits," presented at the IMAPS Int. Conf. High Temperature Electron., June 2016 [Online]; Available: http://dx.doi.org/10.4071/2016-HITEC-249.

Sensing structures in which piezoelectric aluminum nitride (AlN) thin films are formed on silicon carbide (SiC) wafers are also known. For example, a MEMS fabrication process for making structures of that kind is reported in B. A. Griffin et al., "Development of an Aluminum Nitride-Silicon Carbide Material Set for High Temperature Sensor Applications," *Proc. SPIE* 9113, *Sensors for Extreme Harsh Environments*, 91130A (5 Jun. 2014); doi: 10.1117/12.2050896 (hereinafter, "Griffin 2014"), the entirety of which is hereby incorporated herein by reference.

Figure 1:
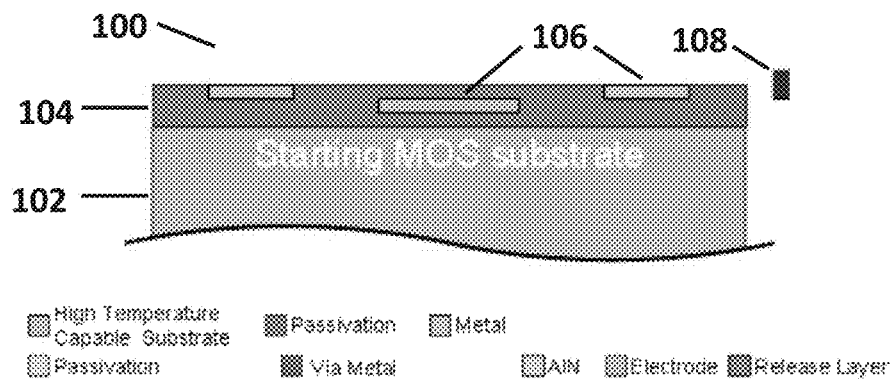
FIG. 1 illustrates a preparatory step in an example process for monolithically integrating a SiC-based MOS integrated circuit with a suspended piezoelectric aluminum nitride member.

FIG. 1 illustrates a preparatory step in an example process for monolithically integrating a SiC-based MOS integrated circuit with a suspended piezoelectric aluminum nitride member, which may be, e.g., a membrane, plate, or beam. A processed MOS structure is provided. The MOS structure may include one or more MOS integrated circuits. In the example shown in the figure, the MOS structure 100 includes a high-temperature-capable MOS substrate 102, a passivation layer 104, and one or more layers of metallization 106 that are isolated by the passivation layer 104. Metal vias 108 may also be included for interconnection between various metallization layers.

One example of a high-temperature capable MOS substrate is a single-crystalline SiC wafer. Possible alternatives include layers of suitable III-V materials grown on SiC or sapphire wafers. Suitable III-V materials for applications to high-temperature MOS include aluminum nitride, gallium nitride, and aluminum gallium nitride.

The MOS passivation layer 104 should have a high-temperature capable composition. Silicon dioxide may be suitable in some applications, although its temperature range is limited because it begins to flow at about 950° C. A dielectric that maintains its integrity at 1000° C. or more would be preferable. Aluminum nitride is an example of a dielectric material that can be used for the passivation layer and that remains usable above 1000° C. Although silicon carbide is, strictly speaking, a wide-bandgap semiconductor and not a dielectric, it may also be useful for passivation layer 104 in at least some applications.

Another possible dielectric material for MOS passivation is silicon nitride, as it has high dielectric strength and a higher coefficient of thermal expansion than silicon dioxide. However, it should be noted that stoichiometric $Si_3N_4$ has a high residual film stress and it might not be compatible with the etchant chemistry used for releasing the suspended aluminum nitride member. For that reason, a slightly silicon-rich nitride might be preferable.

Because the post-MOS processing may include processing at high temperatures, it is desirable to employ, for the MOS metallization, metals that can withstand process temperatures of 1000° C. or more. Suitable examples include, without limitation, titanium, molybdenum, platinum, rubidium, niobium, and hafnium.

Figure 2:
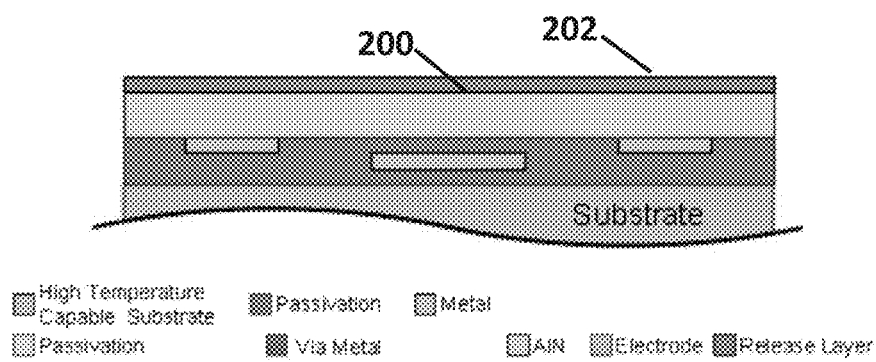
FIG. 2 illustrates an initial step in the process of monolithic integration. As shown in the figure, a post-MOS passivation layer is deposited over the MOS passivation layer, and a release layer is deposited.

FIG. 2 illustrates an initial step in the process of monolithic integration. As shown in the figure, a post-MOS passivation layer 200 is deposited over the MOS passivation layer 104. A release layer 202 is then deposited over the post-MOS passivation layer.

The purpose of post-MOS passivation layer 200 is to separate the release layer from the top-level metallization layer of the MOS structure 100. A useful thickness for the post-MOS passivation layer would lie, for example, in the range from several hundred to several thousand nanometers.

In a nonlimiting example, the post-MOS passivation layer 200 is composed of amorphous or polycrystalline silicon carbide. A suitable process for SiC deposition is a process of low-pressure chemical vapor deposition (LPCVD) in which a chlorinated hydrocarbon gas and a chlorosilicon gas are reacted at a temperature in the range, e.g., 750-1000° C. Notably, the process can be carried out so to produce a silicon carbide film that includes alpha-SiC. The process is described in U.S. Pat. No. 9,546,420, which issued on Jan. 17, 2017 to S. D. Habermehl under the title "Methods of depositing an alpha-silicon-carbide-containing film at low temperature," which is commonly owned herewith, and the entirety of which is hereby incorporated herein by reference.

The deposition of a silicon carbide film for post-MOS passivation layer 200 is one example of a post-MOS process that requires high-temperature-compatible MOS metallization.

The release layer 202 is blanket deposited, and it is subsequently patterned and defined using a suitable etchant. An example composition for the release layer is polycrystalline silicon.

It is important to note in this regard that the composition of the release layer must be selected jointly with the selection of the electrode materials for the piezoelectric aluminum nitride layer that is to be added in a later step. The reason is that the etchant used to remove the release layer (from underneath the aluminum nitride) must not damage the electrodes that it comes into contact with.

For example, molybdenum has desirable properties as a bottom-electrode material for the AlN film because it is a refractory metal and because it provides a good growth surface for aluminum nitride. However, the choice of molybdenum as an electrode material could preclude the use of silicon in the release layer. The reason is that polysilicon release layers are typically etched with fluorine-based etchants such as xenon difluoride and sulfur hexafluoride, which also attack molybdenum.

As will be seen below, the release layer 202, after it is patterned and etched, is buried by deposition of a structural layer that will support the suspended piezoelectric member. In an alternative process for making a buried release layer, a silicon nitride hard mask is deposited directly on the surface of post-MOS passivation layer 200, which for that purpose is composed of, e.g., polycrystalline aluminum nitride. A window is opened in the hard mask, and through the window, a release pit is etched into the post-MOS passivation layer. The polysilicon for the release layer is deposited to fill the release pit, and then planarized by chemical-mechanical polishing (CMP) to expose a flush surface, followed by removal of the SiN hard mask.

Figure 3:
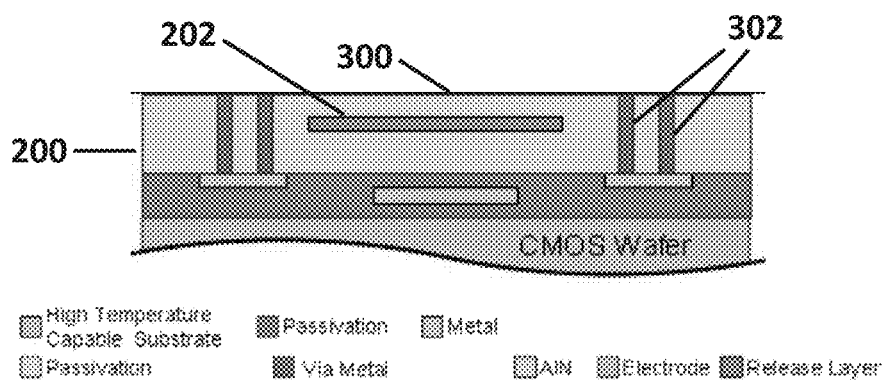
FIG. 3 shows the structure after the patterning and etching of the release layer and deposition of structural layer.

FIG. 3 shows the structure after the patterning and etching of the release layer 202 and deposition of the structural layer 300. As seen in the figure, the structural layer buries the release layer 202. The structural layer provides the surface onto which the bottom electrodes for the piezoelectric layer will be deposited. Example compositions for the structural layer include silicon carbide and aluminum nitride. The structural layer may be polycrystalline or amorphous.

Other compositional choices for the structural layer may be dictated by concern for thermal compatibility. That is, temperature-induced bending could occur if different layers have substantially different coefficients of thermal expansion. This may militate for the use of a material set that is as consistent as possible, or that at least employs materials with similar coefficients of thermal expansion.

For applications in which the piezoelectric film must exhibit a resonant frequency that is stable against temperature changes, it may, by contrast, be desirable to pair the AlN piezoelectric material with a material for the structural layer that stiffens with increasing temperature. Such a pairing can be useful to maintain a low temperature coefficient of frequency. One material useful in that regard is silicon dioxide.

Another possible composition for the structural layer is silicon carbide. It will be seen below that nitrogen-doped silicon carbide is a candidate material for the bottom electrodes that come into contact with the structural layer. It might be supposed that junction leakage would pose a problem if a homojunction between SiC and SiC:N is formed. However, a reverse bias can be applied to suppress leakage. The same considerations would apply to a heterojunction such as one formed between SiC:N bottom electrodes and a structural layer of AlN.

Of course any material composition chosen for the structural layer must be high-temperature capable.

With further reference to FIG. 3, vias 302 are formed through the structural layer 300 and post-MOS passivation layer 200, extending down to the top metallization of the CMOS structure. These vias are essential to the monolithic integration, as they will establish electrical connection between the top and bottom electrodes of the piezoelectric AlN film and the CMOS integrated circuit. An example material for the vias is tungsten. The vias can be made using, e.g., standard CMOS techniques. In at least some cases, the vias can be formed through both the CMOS passivation layer and the post-MOS passivation layer in a single, unified process.

Figure 4:
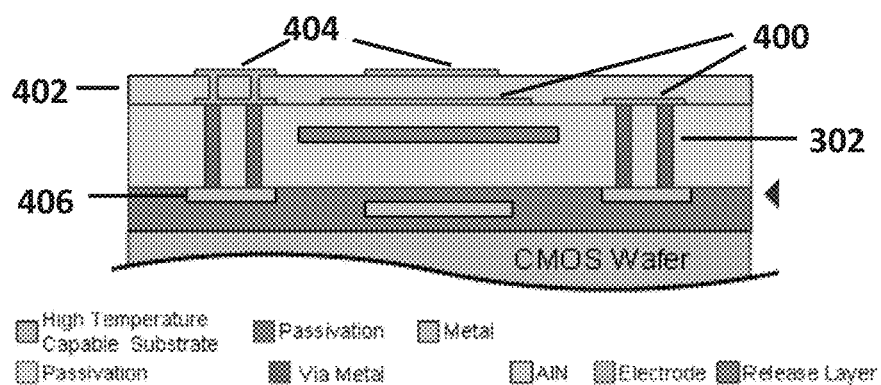
FIG. 4 shows the structure after deposition of a bottom electrode on the structural layer, deposition of the piezoelectric AlN film, and deposition of a top electrode.

FIG. 4 shows the structure after deposition of bottom electrode 400 on the structural layer, deposition of the piezoelectric AlN film 402, and deposition of top electrode 404.

Prior to depositing the bottom electrode, the structural layer is subjected to CMP to prepare a smooth surface for deposition.

The composition for the bottom electrode must be chosen to provide a good aluminum nitride growth surface, i.e., a surface that supports columnar growth of the AlN that will result in piezoelectric properties. The electrode material must also be high-temperature capable and, as noted above, it must be compatible with the chemistry selected for the release etch.

A further requirement is that the structural layer and the bottom electrode must be chemically compatible with each other at high temperature. This concern arises, for example, when titanium is paired with silicon, because a high-temperature reaction can lead to the formation of titanium silicide.

One candidate material for the bottom electrode is nitrogen-doped silicon carbide. For example, a suitable bottom electrode layer can be deposited at 950° C. by the LPCVD methods described in U.S. Pat. No. 9,546,420 and in Griffin 2014, both cited above. As explained in Griffin 2014, the n-type SiC:N film is formed by adding a flow of ammonia to the reaction chamber. The resistivity of the resulting film can be controlled with the range 20 Ω-cm to 1 mΩ-cm by varying the flow rate of ammonia between 0.2 sccm and 2.0 sccm.

After deposition, the bottom electrode layer is planarized by CMP and patterned and defined using a physical or chemical etch. The bottom electrodes do not need to be polished. Instead, a standard surface preparation such as a soft RF etch in vacuum is sufficient.

Some examples of bottom electrode materials that are refractory and provide a suitable growth surface for AlN are titanium (Ti), titanium nitride (TiN), Ti—TiN bilayers, molybdenum, platinum, rubidium, and niobium. More information on this topic may be found in chapter 1 of H. Bhugra and G. Piazza, eds., "Piezoelectric MEMS Resonators", Springer International Publishing, 2017.

It should be noted in this regard that Ti and TiN electrodes would need to be protected against oxidation by encapsulation. Both Ti and TiN are compatible with fluorine release etches, but Ti is not compatible with release by hydrofluoric acid etch.

It should also be noted that it would be feasible to make both the structural layer and the bottom electrode from silicon carbide (with suitable doping of the electrode layer).

That combination may be advantageous because it offers continuity of the material thermal expansion coefficient.

With further reference to FIG. 4, the SiC bottom electrode layer is polished by CMP to provide a suitable template surface for AlN growth, and then the piezoelectric aluminum nitride film 402 is grown by reactive sputter deposition. As discussed in Griffin 2014, sputter-deposited AlN must grow with a columnar morphology in order to exhibit piezoelectric properties.

As a general rule, an amorphous or crystallographically oriented growth surface should be provided in order to ensure that the sputtered AlN will grow with the desired morphology. A polycrystalline growth surface is less favored because it is less conducive to the desired growth. Thus if the bottom electrode comprises doped SiC, for example, it would be considered advantageous to add an overlayer of amorphous or single-crystalline material prior to the AlN deposition. For example, in experimental studies of the growth of AlN on SiC, we added a thin layer of amorphous silicon by a PETEOS process as the AlN growth surface and confirmed this led to a piezoelectric layer with columnar morphology.

Although a PETEOS is effective for this purpose, it is not fully high-temperature-capable, because it tends to soften as the glass transition temperature is approached. A possible alternative is to provide a film of an amorphous conducting oxide as the growth surface. One possible such material is niobium oxide. Another, which may be suitable although it has a relatively high sheet resistance, is tantalum oxide.

We currently believe that it is feasible to grow a piezoelectric film of AlN directly on, e.g., a titanium/titanium nitride bilayer constituting a bottom electrode, even though the morphology of the TiN is polycrystalline. However, it would be preferable to add a layer of platinum, as platinum is refractory, is believed to provide a suitable growth surface, and is readily deposited over titanium. Accordingly, a titanium/platinum bilayer is believed to be a particularly good choice for the bottom electrode. Another good choice would be a titanium/molybdenum bilayer.

A possible alternative AlN deposition method is metalorganic chemical vapor deposition (MOCVD), for successful growth using that technique, the underlying material would need to have a well-defined granular morphology.

There are possible alternatives to AlN as the composition of the piezoelectric film. These alternatives include gallium nitride and other Group-III nitride piezoelectric materials. The alternatives also include scandium aluminum nitride, titanium magnesium aluminum nitride, and other alloyed Group III-nitride piezoelectric materials.

It should be noted in this regard that it would be feasible to deposit an AlN piezoelectric layer directly on a structural layer that is likewise composed of AlN. This need not be prohibited by concern for the integrity of the structural layer during subsequent etching to define the geometry of the piezoelectric layer. The reason is that such an etch does not need to stop at the structural layer. Instead, it can proceed until it is stopped at a metal electrode or even until it stops in the release layer.

After patterning the piezoelectric AlN film 402, its geometry is defined with a chlorine-based etch. As shown in the figure, the etch includes cutting cavities for electrical connections 404. These cavities extend down to the underlying tungsten vias 302, which serve as etch stops. As explained below, the cavities will be filled with metal during the formation of the top electrodes 406. The resulting connections 404, together with the vias to which they connect, will electrically couple the top electrodes 406 to the MOS integrated circuit.

With further reference to FIG. 4, the top electrodes 406 are next deposited, patterned, and etched.

The basic material requirements for the top electrode are that it must be high-temperature-capable, it must make good via contacts, it must be compatible with the etches, and it must either self-passivate or be amenable to passivation. If high-temperature deposition is required (as is the case, for example, with SiC), the thermal budget must be compatible with the underlying MOS metallization.

Any of the materials mentioned above as candidate materials for the bottom electrodes are suitable. Some particular choices are SiC, TiN, and Ta.

Tantalum, especially, is a good candidate because tantalum oxide is a good passivation surface. Rubidium oxide, which is an electrical conductor, is another suitable electrode material. Rubidium oxide can be initially deposited as metallic rubidium that is subsequently oxidized, or alternatively, the oxide can be sputter-deposited directly.

Figure 5:
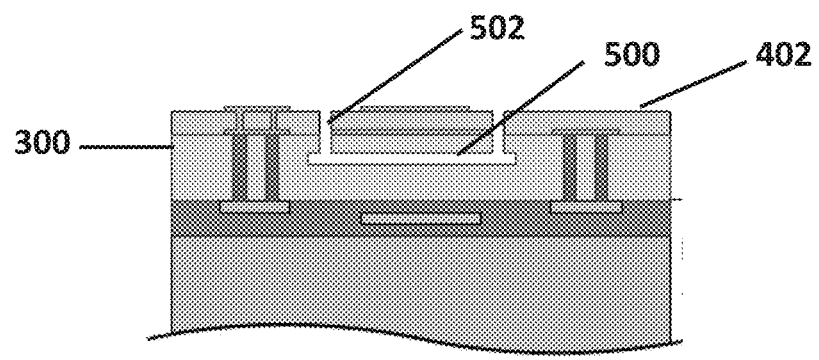
FIG. 5 is a view of the structure after an etch to release the AlN film.

FIG. 5 is a view of the structure after the release etch. As shown in the figure, the release pit 500 is etched away through release trenches 502 cut in the piezoelectric AlN film 402 and the structural layer 300. A dry etch is used to cut the trenches. A chlorine-based etch is used for AlN.

For a polycrystalline silicon release layer, the release is performed by xenon difluoride-based etching or by chemical dry etching (CDE). More generally, fluorine-based etch is effective when the release layer consists of polycrystalline or amorphous silicon, germanium, or silicon-germanium alloy.

CDE is effective when the release layer consists of silicon nitride. A wet or vapor hydrofluoric acid etch is effective when the release layer consists of silicon dioxide.

It should be noted in this regard that if the release etch is oxide-based, the etchant will not attack AlN, SiC, GaN, molybdenum, or platinum, but it will attack titanium. For that reason, titanium electrodes, if they are used, are desirably encapsulated for protection.

Figure 6:
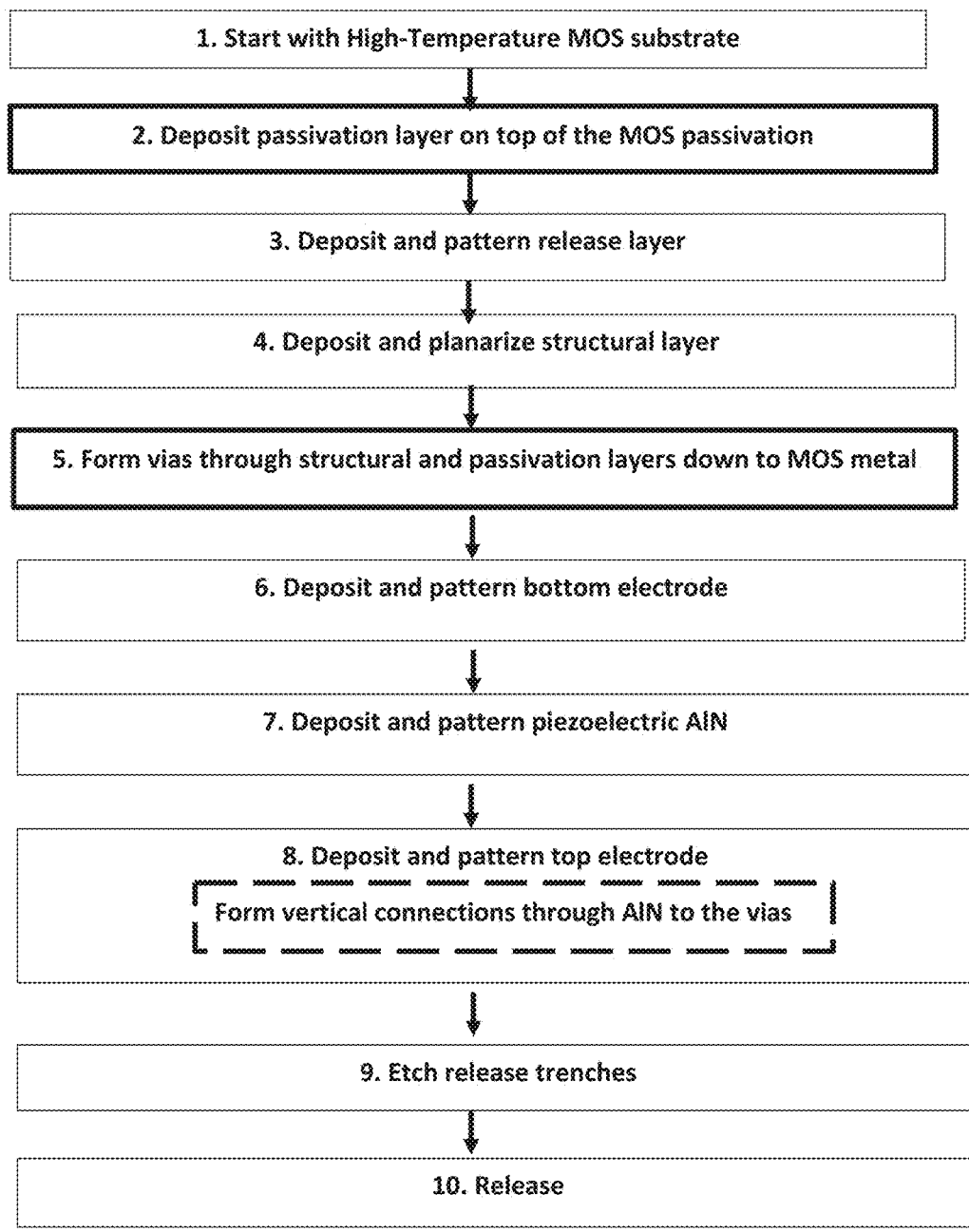
FIG. 6 is a summary of the process steps illustrated in the preceding figures.

The above-described process is summarized in FIG. 6. Ten steps are represented in the figure:

(1) Start with a high-temperature MOS substrate;
(2) Deposit the passivation layer on top of the passivation layer of the MOS substrate; this step is a special adaptation for effectuating the monolithic integration of the MOS structure with the MEMS structure;
(3) Deposit and pattern the release layer;
(4) Deposit and planarize the structural layer;
(5) Form vias through the structural and passivation layers down to the MOS metallization; this step is a special adaptation for effectuating the monolithic integration of the MOS structure with the MEMS structure;
(6) Deposit and pattern the bottom electrode;
(7) Deposit and pattern the piezoelectric AlN;
(8) Deposit and pattern the top electrode; this step includes the forming of vertical connections through the AlN film to the tungsten vias in the underlying layers; the forming of these vertical connections is a special adaptation for effectuating the monolithic integration of the MOS structure with the MEMS structure;
(9) Etch release trenches; and
(10) Release the AlN film.

We claim:

1. Apparatus comprising a high-temperature-capable MOS component monolithically integrated with a post-MOS component comprising a suspended piezoelectric aluminum nitride member, wherein:

(a) the MOS component comprises:
an MOS integrated circuit formed in a high-temperature-capable substrate, wherein the MOS integrated circuit has one or more levels of refractory metal conductors isolated by an MOS passivation layer of dielectric material;
(b) the post-MOS component comprises:
a structural layer;
a bottom electrode directly overlying the structural layer, wherein the bottom electrode comprises doped silicon carbide, titanium, a titanium/platinum bilayer, a titanium/molybdenum bilayer, or a titanium/titanium nitride bilayer;
a layer of piezoelectric aluminum nitride directly overlying the bottom electrode;
a top electrode directly overlying the layer of piezoelectric aluminum nitride; and
a cavity underlying at least a portion of the piezoelectric aluminum nitride layer, whereby the at least a portion of the piezoelectric aluminum nitride that overlies the cavity constitutes the monolithically integrated, suspended piezoelectric aluminum nitride member;
(c) the apparatus further comprises:
a post-MOS passivation layer of silicon carbide atop the MOS passivation layer and beneath the structural layer;
at least one vertical conductor extending through the layer of piezoelectric aluminum nitride from the top electrode to the structural layer, wherein the vertical conductor has the same composition as at least part of the top electrode; and
at least one bottom-electrode via that passes through the structural layer and through the post-MOS passivation layer, wherein the bottom-electrode via connects the bottom electrode to a refractory metal conductor of the MOS integrated circuit; and
(d) the cavity is bounded from above by material of the structural layer and bounded from below by material of the post-MOS passivation layer.

2. The apparatus of claim 1, wherein the high-temperature-capable substrate is a silicon carbide substrate.

3. The apparatus of claim 1, wherein the structural layer comprises silicon carbide, aluminum nitride, or silicon dioxide.

4. The apparatus of claim 1, wherein the bottom electrode comprises silicon carbide or a titanium/titanium nitride bilayer.

5. The apparatus of claim 1, wherein the top electrode comprises silicon carbide or a titanium/titanium nitride bilayer.

6. The apparatus of claim 1, wherein the MOS passivation layer of dielectric material comprises silicon dioxide, aluminum nitride, or silicon carbide.

7. The apparatus of claim 1, wherein the apparatus further comprises at least one top-electrode via that passes through the structural layer and through the post-MOS passivation layer, wherein the top-electrode via connects one of the vertical conductors to a refractory metal conductor of the MOS integrated circuit.

8. The apparatus of claim 1, wherein the bottom electrode comprises doped silicon carbide.

9. The apparatus of claim 1, wherein the bottom electrode comprises a titanium/platinum bilayer.

10. The apparatus of claim 1, wherein the bottom electrode comprises a titanium/titanium nitride bilayer.

11. The apparatus of claim 1, wherein the bottom electrode comprises an amorphous conducting oxide.

12. A method for fabricating an apparatus in which a high-temperature-capable MOS integrated circuit is monolithically integrated with a MEMS device, comprising:
providing an MOS integrated circuit formed in a high-temperature-capable substrate and having one or more levels of refractory metal conductors isolated by an MOS passivation layer;
depositing a post-MOS passivation layer of silicon carbide atop the MOS passivation layer by low-pressure chemical vapor deposition (LPCVD); and
fabricating the MEMS device;
wherein fabricating the MEMS device comprises:
(a) forming a sacrificial release layer over the post-MOS passivation layer;
(b) depositing a structural layer over the post-MOS passivation layer so as to bury the sacrificial release layer;
(c) depositing a bottom electrode over the structural layer, depositing a layer of piezoelectric aluminum nitride over the bottom electrode, and depositing a top electrode over the piezoelectric aluminum nitride layer; and
(d) removing the sacrificial release layer so as to at least partially suspend the piezoelectric aluminum nitride layer;
and wherein the method further comprises:
forming vias that pass vertically through the structural layer and the post-MOS passivation layer and make electrical contact to refractory metal conductors of the MOS integrated circuit;
creating at least one hole in the piezoelectric aluminum nitride layer that extends down to the structural layer; and
filling the at least one hole with an electrical conductor concurrently with the depositing of the top electrode.

13. The method of claim 12, wherein the sacrificial release layer is formed of polycrystalline silicon.

14. The method of claim 12, wherein the structural layer comprises silicon carbide deposited by LPCVD.

15. The method of claim 12, wherein the bottom electrode comprises doped silicon carbide deposited by LPCVD.

16. The method of claim 12, wherein the bottom electrode comprises a titanium/titanium-nitride bilayer deposited by sputtering.

17. The method of claim 12, wherein the depositing the layer of piezoelectric aluminum nitride over the bottom electrode is carried out by reactive sputter deposition.

18. The method of claim 12, wherein the depositing the layer of piezoelectric aluminum nitride over the bottom electrode is carried out by metalorganic chemical vapor deposition.

19. The method of claim 12, wherein the removing the sacrificial release layer comprises:
etching release trenches through the piezoelectric aluminum nitride layer and through the structural layer down to the sacrificial release layer; and
removing the sacrificial release layer by isotropic fluorine-based etching.

* * * * *